United States Patent
Oka et al.

(10) Patent No.: US 8,691,665 B2
(45) Date of Patent: Apr. 8, 2014

(54) METHOD FOR PRODUCING BONDED WAFER

(75) Inventors: Satoshi Oka, Annaka (JP); Hiroji Aga, Annaka (JP); Masahiro Kato, Annaka (JP); Nobuhiko Noto, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 13/514,414

(22) PCT Filed: Nov. 18, 2010

(86) PCT No.: PCT/JP2010/006754
§ 371 (c)(1),
(2), (4) Date: Jun. 7, 2012

(87) PCT Pub. No.: WO2011/086628
PCT Pub. Date: Jul. 21, 2011

(65) Prior Publication Data
US 2012/0244679 A1    Sep. 27, 2012

(30) Foreign Application Priority Data

Jan. 12, 2010  (JP) ................. 2010-004271

(51) Int. Cl.
*H01L 21/30* (2006.01)
*H01L 21/46* (2006.01)
*H01L 21/00* (2006.01)

(52) U.S. Cl.
USPC ..... 438/459; 438/458; 438/455; 257/E21.001

(58) Field of Classification Search
CPC .............. H01L 21/683; H01L 21/687; H01L 21/68714; H01L 21/68721; H01L 21/68728; H01L 21/68735; H01L 21/68742; H01L 21/6875; H01L 21/68757; H01L 21/68764
USPC .................................................. 438/584–588
See application file for complete search history.

(56) References Cited

U.S. PATENT DOCUMENTS 3,652,324 A * 3/1972 Chu et al. ............... 438/694
3,785,862 A * 1/1974 Grill ....................... 438/674

(Continued)

FOREIGN PATENT DOCUMENTS

JP   A-2000-030995   1/2000
JP   A-2001-068424   3/2001

(Continued)

OTHER PUBLICATIONS

Aug. 16, 2012 Translation of International Preliminary Report on Patentability issued in International Patent Application No. PCT/JP2010/006754.

(Continued)

*Primary Examiner* — Scott B Geyer
*Assistant Examiner* — Evren Seven
(74) *Attorney, Agent, or Firm* — Oliff PLC

(57) ABSTRACT

The present invention is directed to a method for producing a bonded wafer, the method in which heat treatment for flattening the surface of a thin film is performed on a bonded wafer made by the ion implantation delamination method in an atmosphere containing hydrogen or hydrogen chloride, wherein the surface of a susceptor on which the bonded wafer is to be placed, the susceptor used at the time of flattening heat treatment, is coated with a silicon film in advance. As a result, a method for producing a bonded wafer is provided, the method by which a bonded wafer having a thin film with good film thickness uniformity can be obtained even when heat treatment for flattening the surface of a thin film of a bonded wafer after delamination is performed in the ion implantation delamination method.

8 Claims, 6 Drawing Sheets

(56) References Cited

U.S. PATENT DOCUMENTS

| | | | |
|---|---|---|---|
| 4,186,684 A * | 2/1980 | Intrater et al. | 118/725 |
| 4,247,859 A * | 1/1981 | Rai-Choudhury et al. | 257/352 |
| 6,120,660 A * | 9/2000 | Chu et al. | 204/298.15 |
| 6,217,724 B1 | 4/2001 | Chu et al. | |
| 6,277,194 B1 * | 8/2001 | Thilderkvist et al. | 117/94 |
| 6,284,629 B1 * | 9/2001 | Yokokawa et al. | 438/459 |
| 6,749,684 B1 * | 6/2004 | Chen et al. | 117/20 |
| 7,022,192 B2 * | 4/2006 | Dip et al. | 118/725 |
| 7,060,944 B2 * | 6/2006 | Ose | 219/444.1 |
| 7,579,261 B2 * | 8/2009 | Schauer et al. | 438/478 |
| 7,591,908 B2 * | 9/2009 | Kanaya et al. | 118/728 |
| 7,838,388 B2 * | 11/2010 | Oka et al. | 438/413 |
| 7,891,975 B2 * | 2/2011 | Sasajima et al. | 432/259 |
| 2003/0049372 A1 * | 3/2003 | Cook et al. | 427/248.1 |
| 2004/0053515 A1 | 3/2004 | Comita et al. | |
| 2007/0062438 A1 | 3/2007 | Schauer et al. | |
| 2007/0077737 A1 * | 4/2007 | Kobayashi et al. | 438/513 |
| 2009/0258474 A1 | 10/2009 | Oka et al. | |
| 2010/0024840 A1 * | 2/2010 | Hsieh et al. | 134/1.1 |
| 2011/0189842 A1 * | 8/2011 | Hager et al. | 438/504 |
| 2012/0174859 A1 * | 7/2012 | Sakamoto et al. | 117/88 |

FOREIGN PATENT DOCUMENTS

| | | |
|---|---|---|
| JP | A-2007-088469 | 4/2007 |
| JP | A-2008-078427 | 4/2008 |
| JP | A-2009-253212 | 10/2009 |

OTHER PUBLICATIONS

Feb. 15, 2011 International Search Report issued in International Patent Application No. PCT/JP2010/006754.

May 31, 2013 Extended European Search Report issued in Application No. EP 10 84 2988.7.

Sep. 3, 2013 Office Action issued in Japanese Patent Application No. 2010-004271 (with partial English-language Translation).

* cited by examiner

HEAT TREATMENT UNDER ATMOSPHERE OF HYDROGEN OR HYDROGEN CHLORIDE

SILICON FILM COATING

HEAT TREATMENT UNDER ATMOSPHERE OF HYDROGEN OR HYDROGEN CHLORIDE (a)

(b)

(a)

(b)

METHOD FOR PRODUCING BONDED WAFER

TECHNICAL FIELD

The present invention relates to a method for producing a bonded wafer, the method using an ion implantation delamination method.

BACKGROUND ART

In a method for producing a bonded wafer, as a method by which two wafers are bonded together and then one wafer is turned into a thin film, a method by which two wafers are bonded together and then one wafer is turned into a thin film by grinding/polishing and an ion implantation delamination method (also called the SmartCut (registered trademark) method) have been generally known.

The method by which two wafers are bonded together and then one wafer is turned into a thin film by grinding/polishing is specifically a method by which, for example, two silicon wafers are directly bonded or bonded with an oxide film sandwiched between them without using an adhesive, the bonding strength is increased by heat treatment (1000 to 1200° C.), and then one wafer is turned into a thin film by grinding/polishing. The advantages of this method are the crystallinity of an SOI layer and the reliability of a buried oxide film that are equal to those of an ordinary silicon wafer, and the drawbacks thereof are a film thickness uniformity limitation (about ±0.3 µm at most) of the SOI layer and high costs due to the use of two silicon wafers in the production of one SOI wafer.

On the other hand, the ion implantation delamination method is specifically a method by which, for example, after an ion implanted layer (a delaminating layer) is formed inside a wafer by implanting a gas ion of at least one of a hydrogen ion and a rare gas ion into one principal surface of at least one wafer (a bond wafer) of two silicon wafers, the ion implanted surface and one principal surface of the other silicon wafer (a base wafer) are brought into intimate contact with each other directly or through an oxide film, and the bond wafer is delaminated at the ion implanted layer by performing heat treatment at a temperature of 300° C. or higher. The ion implantation delamination method has advantages that, for example, a thin-film SOI wafer with SOI layer film thickness uniformity of ±10 nm or less can be made easily and cost reduction can be achieved by reusing the delaminated bond wafer more than once. However, due to the roughness of the surface of the SOI wafer immediately after delamination, the SOI wafer cannot be used directly as a substrate for fabricating a device, and an additional process for flattening is required.

As flattening processing, flattening by CMP (Chemical Mechanical Polishing), flattening by high-temperature heat treatment in an atmosphere of an inert gas, and flattening by heat treatment in an atmosphere of hydrogen or hydrogen chloride gas have been generally known. From a cost reduction standpoint, it has been considered that a method by which flattening heat treatment is performed in an atmosphere of hydrogen or hydrogen chloride is the most advantageous method (Patent Document 1).

The above-described flattening heat treatment in an atmosphere of hydrogen or hydrogen chloride will be described specifically. For example, when a bonded wafer is produced by the ion implantation delamination method by using a silicon single crystal wafer, as shown in FIG. 2, after a surface of a bond wafer 11, the surface in which an ion implanted layer 12 is formed, and a surface of a base wafer 13 are bonded together with an oxide film 14 sandwiched between them (FIG. 2(a)), the bond wafer 11 is delaminated at the ion implanted layer 12, whereby a bonded wafer 16 having a silicon thin film (an SOI layer) 15 on the base wafer 13 is made (FIG. 2(b)). Then, to reduce the roughness of the silicon thin film after delamination, heat treatment (hereinafter also referred to as gas etching) is performed on the bonded wafer 16 after delamination in an atmosphere containing hydrogen or hydrogen chloride by using a single wafer processing epitaxial layer growth reactor or the like (FIG. 2(c)).

However, this method is a method by which the SOI layer is flattened while being etched, and the film thickness distribution of the SOI layer exhibits lack of uniformity, and the SOI layer is thin on the periphery of the wafer and is thick in the central part thereof. As described above, when the thin film (the SOI layer) has poor film thickness uniformity, device characteristics vary, and therefore improvement of the film thickness uniformity of the bonded wafer is required.

CITATION LIST

Patent Literature

Patent Document 1: JP-A-2000-30995

DISCLOSURE OF INVENTION

The present invention has been made in view of the circumstances described above, and an object thereof is to provide a method for producing a bonded wafer, the method by which a bonded wafer having a thin film with good film thickness uniformity can be obtained even when heat treatment for flattening the surface of a thin film of a bonded wafer after delamination is performed in the ion implantation delamination method.

To solve the problem described above, the present invention provides a method for producing a bonded wafer, the method in which an ion implanted layer is formed by implanting a gas ion of at least one of a hydrogen ion and a rare gas ion from a surface of a bond wafer, a bonded wafer having a thin film on a base wafer is made by bonding the ion implanted surface of the bond wafer and a surface of a base wafer directly or through an oxide film and then delaminating the bond wafer at the ion implanted layer, and heat treatment for flattening the surface of the thin film is then performed on the bonded wafer in an atmosphere containing hydrogen or hydrogen chloride, wherein the surface of a susceptor on which the bonded wafer is to be placed, the susceptor used at the time of the flattening heat treatment, is coated with a silicon film in advance.

As described above, in the ion implantation delamination method, by coating the surface of a susceptor with a silicon film in advance, the susceptor on which a bonded wafer is to be placed, before heat treatment for flattening the surface of a thin film of a bonded wafer after delamination, the heat treatment performed in an atmosphere containing hydrogen or hydrogen chloride, when a bonded wafer is placed on the susceptor and flattening heat treatment is performed, etching on the periphery of the bonded wafer is curbed, making it possible to perform flattening heat treatment with good film thickness uniformity and produce a bonded wafer with a high degree of flatness.

Moreover, as the bond wafer and the base wafer, silicon single crystal wafers can be used.

As described above, as the bond wafer and the base wafer, silicon single crystal wafers can be used, making it possible to produce a bonded wafer having a silicon thin film with good film thickness uniformity.

Furthermore, it is preferable that the silicon film with which the susceptor is coated coat a surface other than a region in which a back surface of the bonded wafer is to make contact with the susceptor.

As described above, by coating a surface with the silicon film with which the susceptor is to be coated, the surface other than a region in which the back surface of the bonded wafer is to make contact with the susceptor, the silicon film does not make contact with the back surface of the bonded wafer. This makes it possible to prevent a projection from being generated on the back surface of the bonded wafer after flattening heat treatment and obtain a bonded wafer having a thin film with good film thickness uniformity and having the back surface on which generation of a projection is prevented.

Moreover, it is preferable that the surface of the susceptor other than a region in which the back surface of the bonded wafer and the susceptor is to make contact with each other be coated with the silicon film by placing a dummy wafer on the susceptor, coating the surface of the susceptor with the silicon film, and then removing the dummy wafer.

As described above, by placing a dummy wafer on the susceptor and removing the dummy wafer after coating the surface of the susceptor with the silicon film, it is possible to coat the surface with the silicon film in advance, the surface other than a region in which the back surface of the bonded wafer is to make contact with the susceptor.

Furthermore, it is preferable that an epitaxial layer be grown on the thin film of the bonded wafer on which the flattening heat treatment was performed.

As described above, by growing an epitaxial layer on the thin film of the bonded wafer which was uniformly flattened by using the method for producing a bonded wafer of the present invention, it is possible to obtain an epitaxial layer with good film thickness uniformity and produce a bonded wafer with a thick SOI layer etc. using the ion implantation delamination method.

As described above, in the ion implantation delamination method, by coating the surface of a susceptor with a silicon film in advance, the susceptor on which a bonded wafer is to be placed, the susceptor used in heat treatment for flattening the surface of a thin film, the heat treatment performed after delamination, etching on the periphery of a bonded wafer is curbed at the time of flattening heat treatment, whereby it is possible to produce a bonded wafer having a thin film with good film thickness uniformity. Moreover, by coating the surface with the silicon film with which the susceptor is to be coated, the surface other than a region in which the back surface of a bonded wafer is to make contact with the susceptor, the silicon film does not make contact with the back surface of the bonded wafer. This makes it possible to prevent a projection from being generated on the back surface of the bonded wafer after flattening heat treatment.

BEST MODE FOR CARRYING OUT THE INVENTION

Figure 1:
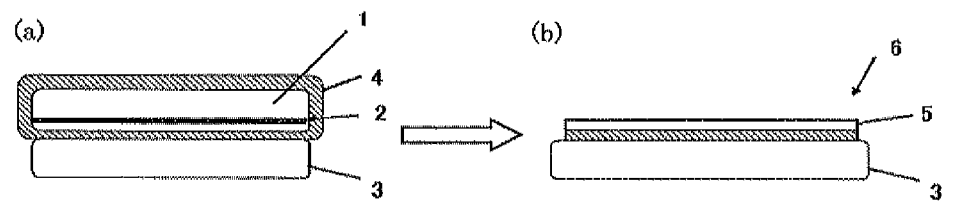
FIG. 1 is an explanatory diagram showing a method for producing a bonded wafer of the present invention.
Figure 1:
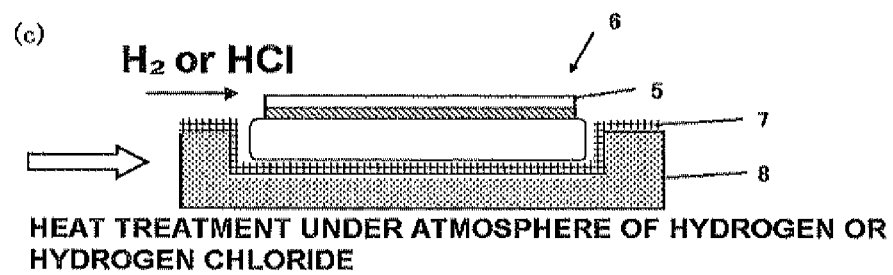
Figure 1:
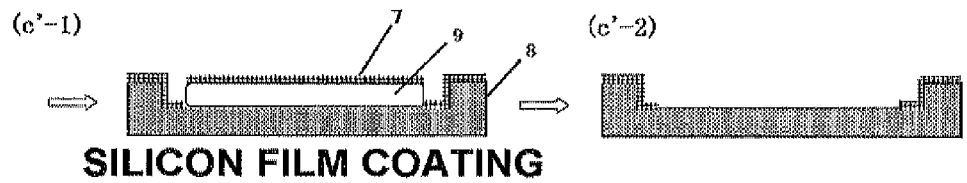
Figure 1:
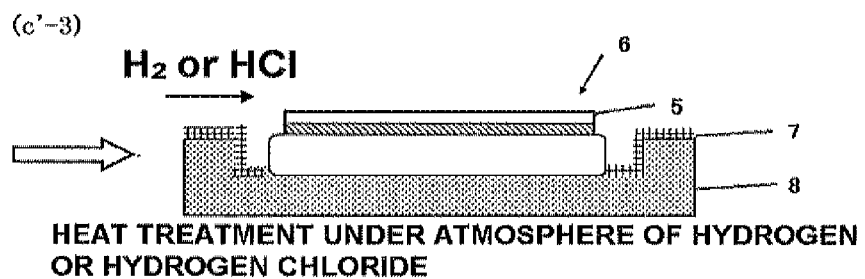
Figure 2:
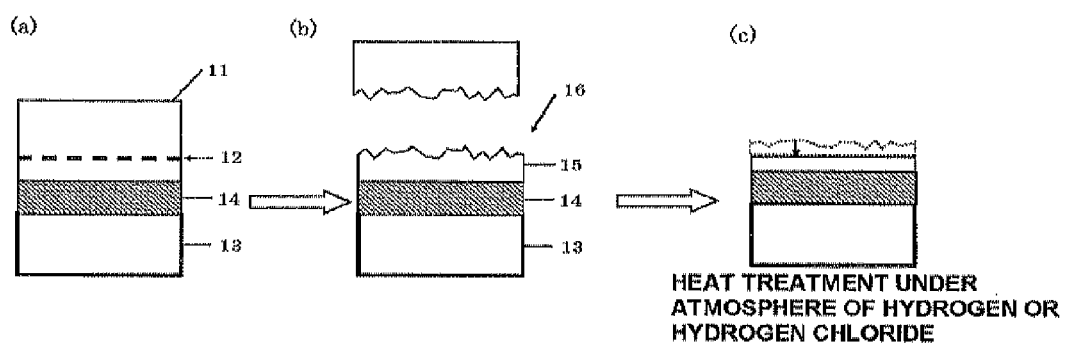
FIG. 2 is an explanatory diagram showing an existing method for producing a bonded wafer.

As described earlier, in the past, when heat treatment for flattening the surface of a silicon thin film was performed in an atmosphere containing hydrogen or hydrogen chloride to reduce the roughness of a silicon thin film (an SOI layer) after delamination, the silicon thin film (the SOI layer) made by the ion implantation delamination method, the film thickness distribution of the silicon thin film exhibited lack of uniformity, and the silicon thin film was thin on the periphery of a wafer and was thick in the central part thereof. It is for this reason that a method for producing a bonded wafer, the method by which a thin film having good film thickness uniformity can be obtained, is required.

Therefore, through an intensive study, the present inventor has found out that, in the ion implantation delamination method, by coating the surface of a susceptor with a silicon film in advance, the susceptor used in heat treatment for flattening the surface of a thin film after delamination, when a bonded wafer is then placed on the susceptor and flattening heat treatment is performed, etching on the periphery of the bonded wafer is curbed, whereby it is possible to perform flattening heat treatment with good film thickness uniformity.

Hereinafter, a method for producing a bonded wafer of the present invention will be described in detail as an example of an embodiment with reference to FIG. 1. However, the present invention is not limited to this example.

First, as a bond wafer 1 and a base wafer 3, two silicon single crystal bare wafers, for example, are prepared, an ion implanted layer 2 is formed by implanting a gas ion of at least one of a hydrogen ion and a rare gas ion from a surface of the bond wafer 1, and the ion implanted surface of the bond wafer 1 and a surface of the base wafer 3 are bonded together with an oxide film 4 sandwiched between them (FIG. 1(a)).

Here, the material of the bond wafer is not limited to a silicon single crystal and a SiGe crystal, a compound semiconductor, and the like can be used. As the material of the base wafer, in addition to a semiconductor material such as a silicon single crystal, an insulating material such as quartz can be used.

Moreover, when the ion implanted layer 2 is formed in the bond wafer 1, other ion implantation conditions such as the implantation energy, the implantation dose, and the implantation temperature can be chosen as appropriate so that a thin film having a predetermined thickness can be obtained.

Furthermore, in FIG. 1(a), the bond wafer 1 and the base wafer 3 are bonded together with the oxide film 4 sandwiched between them. However, in the method for producing a bonded wafer of the present invention, the bond wafer 1 and the base wafer 3 may be bonded together directly without the oxide film 4. When the bond wafer 1 and the base wafer 3 are bonded together with the oxide film 4 sandwiched between them, the oxide film 4 may be formed in advance on one of the bond wafer 1 and the base wafer 3 or may be formed on both wafers.

Next, by delaminating the bond wafer at the ion implanted layer 2, a bonded wafer 6 having a thin film 5 on the base wafer 3 is made (FIG. 1(b)). The delamination is not limited to particular delamination, and can be performed by performing heat treatment at about 300 to 1100° C. under an atmosphere of an inert gas such as Ar, for example.

Moreover, by increasing the bonding strength by performing plasma treatment on the bonding surface of one of the bond wafer 1 and the base wafer 3 or the bonding surfaces of both wafers before bonding the bond wafer 1 and the base wafer 3 together, it is also possible to omit delamination heat treatment and perform delamination mechanically.

Next, the bonded wafer 6 is placed on a susceptor 8 with the surface coated with a silicon film 7 in advance, and heat treatment for flattening the surface of the thin film 5 is performed in an atmosphere containing hydrogen or hydrogen chloride (FIG. 1(c)).

As described above, by coating the surface of the susceptor 8 with the silicon film 7 in advance before flattening heat treatment, etching on the periphery of the bonded wafer 6 is curbed, making it possible to perform etching by which the thin film 5 with good film thickness uniformity can be obtained after flattening heat treatment.

Incidentally, silicon film coating can be performed by using a gas such as silane, trichlorosilane, or dichlorosilane.

Figure 3:
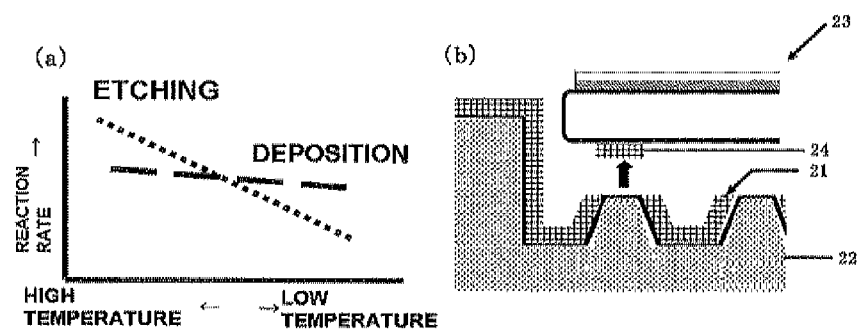
FIG. 3 is an explanatory diagram of a mechanism by which a projection is generated on the back surface of a bonded wafer.

Moreover, depending on the surface shape of the susceptor, when the temperature of the back surface of a bonded wafer is lower than that of the susceptor, due to the difference in activation energy of the silicon film (deposition continues on a low-temperature side) as shown in FIG. 3(a), there are cases in which, as shown in FIG. 3(b), when a bonded wafer 23 is placed on a susceptor 22 coated with a silicon film 21 and flattening heat treatment is performed, the silicon coating the susceptor 22 is etched, moves to the back surface of the bonded wafer 23, and is redeposited thereon, whereby a projection 24 reflecting the surface shape of the susceptor is formed.

Therefore, by coating a surface with a silicon film with which a susceptor is to be coated, the surface other than a region in which the back surface of a bonded wafer is to make contact with the susceptor, that is, by coating a surface with a silicon film in such a way that the silicon film and a bonded wafer do not make contact with each other, it is possible to prevent a projection reflecting the surface shape of the susceptor from being generated on the back surface of the bonded wafer at the time of flattening heat treatment and thereby suppress defocus failure in a photolithography process in the device process.

The surface other than a region in which the back surface of the bonded wafer and the susceptor is to make contact with each other can be coated with the silicon film as just described by placing a dummy wafer 9 on the susceptor 8 as shown in FIG. 1, coating the surface of the susceptor 8 with the silicon film 7 (FIG. 1(c'-1)), and then removing the dummy wafer 9 (FIG. 1(c'-2)).

As described above, by using a dummy wafer, it is possible to make a susceptor with no silicon film in a region in which a bonded wafer is to be placed. By placing the bonded wafer 6 on this susceptor and performing heat treatment for flattening the surface of the thin film 5 (FIG. 1(c'-3)), it is possible to produce the bonded wafer 6 having the thin film 5 with good film thickness uniformity and even having the back surface on which no projection is generated.

Moreover, to increase the productivity of flattening heat treatment in an atmosphere containing hydrogen or hydrogen chloride, it is preferable that, after coating by the silicon film 7 by using the dummy wafer 9 is performed and the dummy wafer 9 is removed, flattening heat treatment be continuously performed on a plurality of bonded wafers 6, and, when the silicon film 7 has lost the effectiveness thereof, the susceptor 8 be coated with the silicon film 7 again by using the dummy wafer 9 and flattening heat treatment be then performed continuously on a plurality of bonded wafers 6.

After flattening heat treatment, an epitaxial layer can be grown on the thin film 5 of the bonded wafer 6 thus obtained, whereby it is possible to obtain an epitaxial layer with good film thickness uniformity from the bonded wafer produced by using the method for producing a bonded wafer of the present invention. Therefore, it is possible to produce a bonded wafer with a thin film such as a relatively thick SOI layer having a uniform film thickness.

EXAMPLES

Hereinafter, the present invention will be described specifically based on Examples and Comparative Example. However, the present invention is not limited to these examples.

Example 1, Example 2, Comparative Example

Two silicon single crystal wafers having a diameter of 300 mm were prepared, and an SOI wafer having an SOI layer 250 nm thick and an oxide film layer 300 nm thick was made by a hydrogen ion implantation delamination method. Then, flattening heat treatment was performed. Before the flattening heat treatment, as shown in Table 1 below, in Example 1, the entire surface of a susceptor on which the SOI wafer was to be placed, the susceptor used at the time of flattening heat treatment, was coated with a silicon film, and, in Example 2, the surface other than a region in which the back surface of the SOI wafer and the susceptor would make contact with each other was coated with a silicon film. In Comparative Example, the susceptor was not coated with a silicon film.

Coating by a silicon film in Example 1 and Example 2 was performed under the following conditions.

Temperature: 1080° C.
Gas flow rate: dichlorosilane 450 sccm, $H_2$ 53 slm
Time: 3 minutes Then, on the susceptors used in Examples and Comparative Example, the susceptors prepared in the manner described above, the above-described SOI wafers were placed, and flattening heat treatment was performed under the conditions described below. Each of the etching amounts of the SOI wafers is shown in Table 1.

Temperature: 1050° C.
Gas flow rate: HCl 400 sccm, $H_2$ 55 slm
Time: 7 minutes

The film thickness uniformity (a value (%) obtained by dividing a P-V value of the SOI film thickness after flattening heat treatment by the etching amount) after flattening heat treatment and the presence or absence of a projection on the back surface of the SOI wafer are also shown in Table 1 below. Moreover, a film thickness distribution of Example 1 after flattening heat treatment and an observation image (a 2 mm square piece) of the back surface of the SOI wafer are shown in FIG. 4(a) and FIG. 4(b), respectively. Likewise, a film thickness distribution of Example 2 after flattening heat treatment and an observation image (a 2 mm square piece) of the back surface of the SOI wafer are shown in FIG. 5(a) and FIG. 5(b), respectively. Furthermore, a film thickness distribution of Comparative Example after flattening heat treatment is shown in FIG. 6.

At this time, an SOT film thickness distribution was measured by using AcuMap manufactured by ADE Corporation, and the back surface was observed by using a non-contact profilometer manufactured by WYKO Corporation. Incidentally, in the sectional views of FIG. 4(a), FIG. 5(a), and FIG. 6, while almost the same scale is used in FIG. 4(a) and FIG. 5(a) as a scale in a film thickness direction, a scale which is about four times larger than the above scale is used in FIG. 6.

In Example 1 and Example 2, after flattening heat treatment, an epitaxial layer was grown (temperature: 1080° C., gas flow rate: dichlorosilane 450 sccm, $H_2$ 53 slm, time: 3 minutes, epitaxial layer film thickness: 3 μm). The film thickness distribution results after epitaxial growth are shown in Table 1.

TABLE 1

|  | Example 1 | Example 2 | Comparative Example |
| --- | --- | --- | --- |
| Susceptor Coating Range | Entire Surface of Susceptor | Other Than Region in which Back Surface of SOI Wafer and Susceptor are to Make Contact with Each Other | — |
| Flattening Heat Treatment Etching Amount | 171 nm | 173 nm | 197 nm |
| Film Thickness Uniformity | 4.7% | 4.9% | 18% |
| Presence or Absence of Projection on Back Surface | Projection Exists | None | None |
| Film Thickness Distribution after Epitaxial Growth | ±1.5% | ±1.5% | — |

Figure 4:
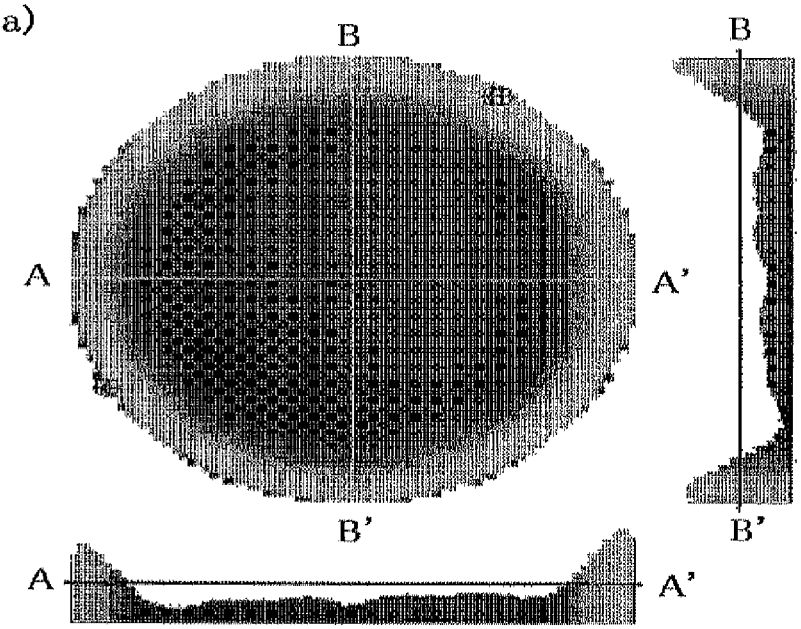
FIG. 4(a) illustrates a film thickness distribution (a plan view, a sectional view taken on the line A-A', and a sectional view taken on the line B-B') after flattening heat treatment and (b) is an observation image of a projection on the back surface of an SOI wafer in Example 1.
Figure 4:
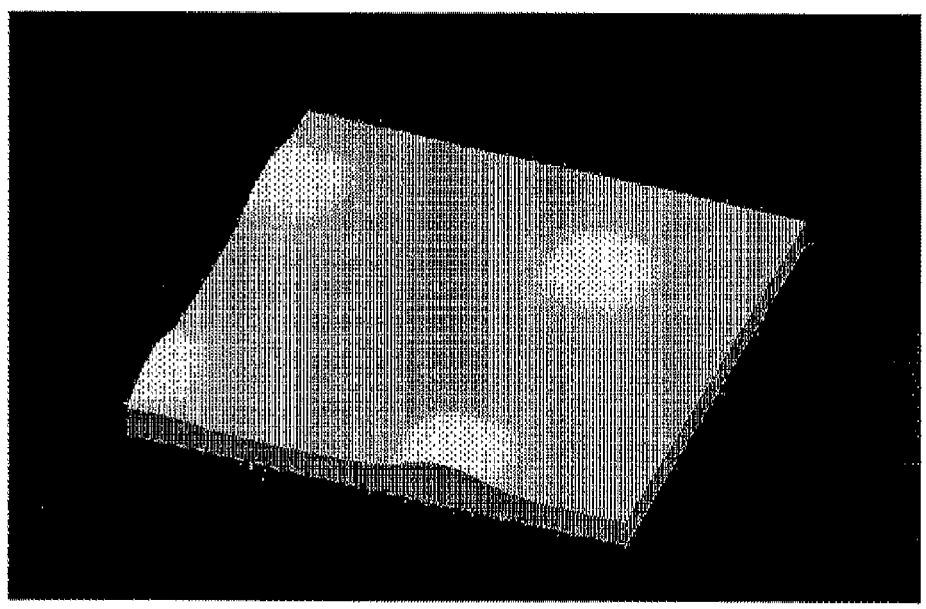
Figure 5:
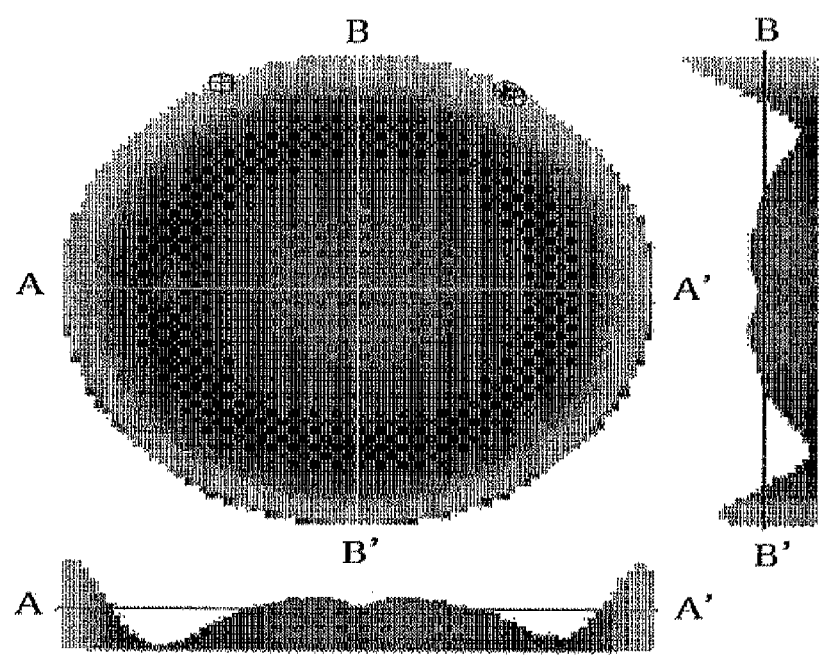
FIG. 5(a) illustrates a film thickness distribution (a plan view, a sectional view on the line A-A', and a sectional view on the line B-B') after flattening heat treatment and (b) is an observation image of a projection on the back surface of an SOI wafer in Example 2.
Figure 5:
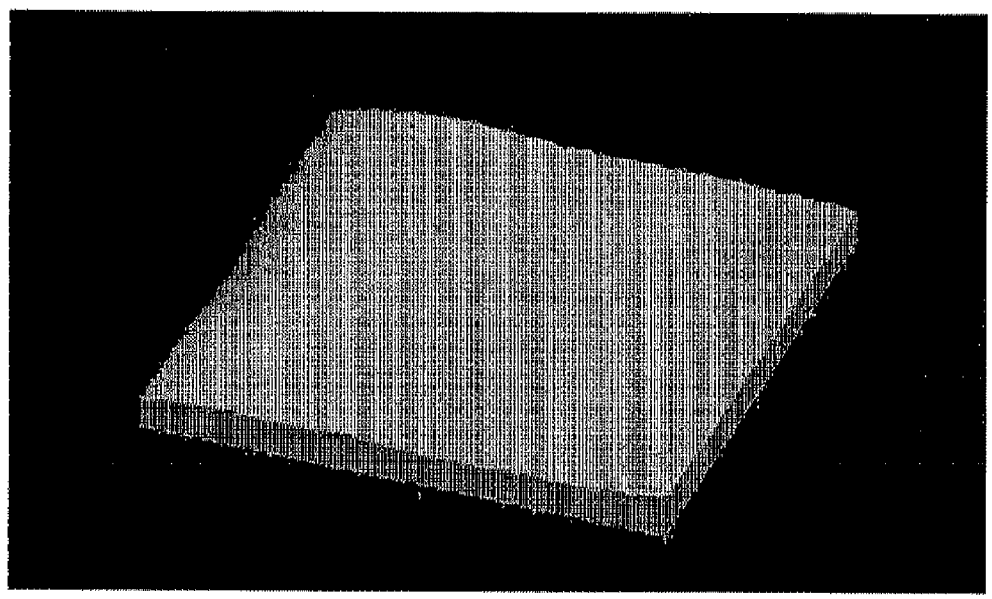
Figure 6:
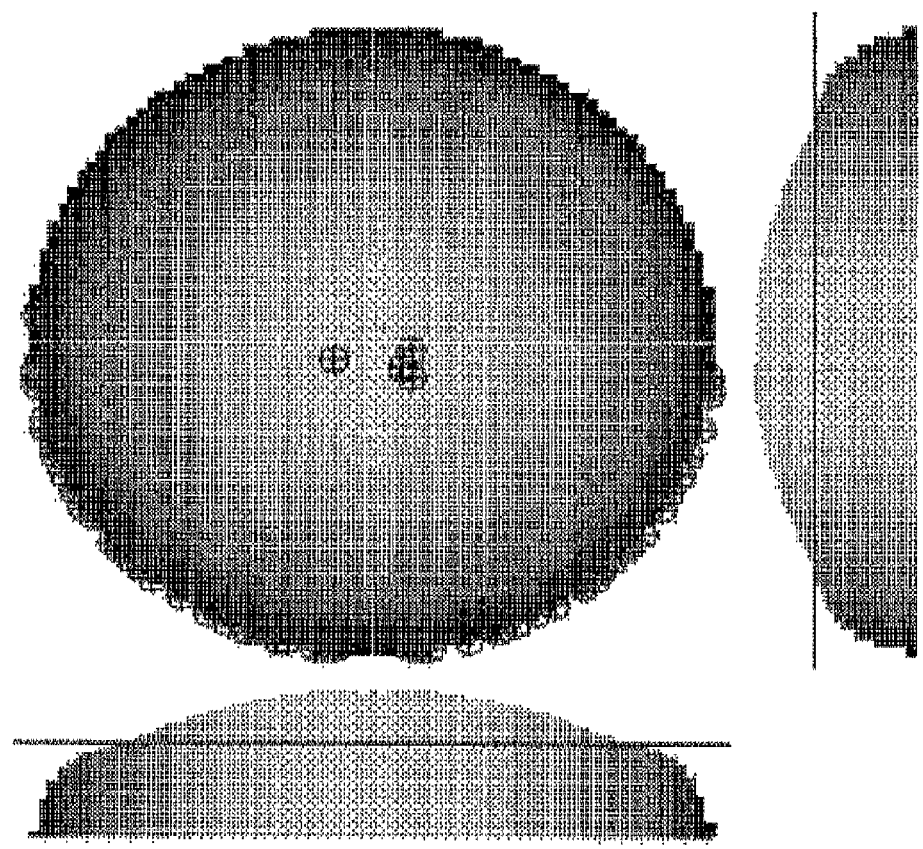
FIG. 6 illustrates a film thickness distribution after flattening heat treatment in Comparative Example.

The results shown in Table 1 above and FIGS. 4 to 6 revealed that coating the surface of the susceptor with a silicon film in advance before flattening heat treatment greatly improved film thickness uniformity. Furthermore, as in Example 2, by coating the surface with a silicon film, the surface other than a region in which the back surface of the bonded wafer and the susceptor would make contact with each other, a projection could be prevented from being generated on the back surface of the bonded wafer during flattening heat treatment. Moreover, in Example 1 and Example 2, it was possible to make an epitaxial wafer with good film thickness uniformity.

It is to be understood that the present invention is not limited in any way by the embodiment thereof described above. The above embodiment is merely an example, and anything that has substantially the same structure as the technical idea recited in the claims of the present invention and that offers similar workings and benefits falls within the technical scope of the present invention.

The invention claimed is:

1. A method for producing a bonded wafer, the method in which an ion implanted layer is formed by implanting a gas ion of at least one of a hydrogen ion and a rare gas ion from a surface of a bond wafer, a bonded wafer having a thin film on a base wafer is made by bonding the ion implanted surface of the bond wafer and a surface of a base wafer directly or through an oxide film and then delaminating the bond wafer at the ion implanted layer, and heat treatment for flattening the surface of the thin film is then performed on the bonded wafer in an atmosphere containing hydrogen or hydrogen chloride, wherein
    the surface of a susceptor on which the bonded wafer is to be placed, the susceptor used at the time of the flattening heat treatment, is coated with a silicon film in advance, and
    in the surface of a bonded wafer-placing surface side of the susceptor, the silicon film with which the susceptor is coated coats a surface other than a region in which a back surface of the bonded wafer is to make contact with the susceptor.

2. The method for producing a bonded wafer according to claim 1, wherein
    as the bond wafer and the base wafer, silicon single crystal wafers are used.

3. The method for producing a bonded wafer according to claim 1, wherein
    the surface of the susceptor other than a region in which the back surface of the bonded wafer and the susceptor are to make contact with each other is coated with the silicon film by placing a dummy wafer on the susceptor, coating the surface of the susceptor with the silicon film, and then removing the dummy wafer.

4. The method for producing a bonded wafer according to claim 2, wherein
    the surface of the susceptor other than a region in which the back surface of the bonded wafer and the susceptor are to make contact with each other is coated with the silicon film by placing a dummy wafer on the susceptor, coating the surface of the susceptor with the silicon film, and then removing the dummy wafer.

5. The method for producing a bonded wafer according to claim 1, wherein
    an epitaxial layer is grown on the thin film of the bonded wafer on which the flattening heat treatment was performed.

6. The method for producing a bonded wafer according to claim 2, wherein
    an epitaxial layer is grown on the thin film of the bonded wafer on which the flattening heat treatment was performed.

7. The method for producing a bonded wafer according to claim 3, wherein
    an epitaxial layer is grown on the thin film of the bonded wafer on which the flattening heat treatment was performed.

8. The method for producing a bonded wafer according to claim 4, wherein
    an epitaxial layer is grown on the thin film of the bonded wafer on which the flattening heat treatment was performed.

* * * * *